(12) United States Patent
Anderson

(10) Patent No.: US 6,600,379 B2
(45) Date of Patent: Jul. 29, 2003

(54) VOLTAGE-CONTROLLED VARIABLE DUTY-CYCLE OSCILLATOR

(75) Inventor: Douglas Anderson, Nevada, IA (US)

(73) Assignee: Micrel, Incorporated, San Jose, CA (US)

( * ) Notice: Subject to any disclaimer, the term of this patent is extended or adjusted under 35 U.S.C. 154(b) by 74 days.

(21) Appl. No.: 10/029,182

(22) Filed: Dec. 21, 2001

(65) Prior Publication Data

US 2003/0117222 A1 Jun. 26, 2003

(51) Int. Cl.[7] ................................................ H03K 3/02
(52) U.S. Cl. .................... 331/113 R; 331/143; 331/144; 327/182
(58) Field of Search ..................... 331/113 R, 108 R, 331/108 A, 108 C, 177 R, 178, 184, 187, 111, 107 R, 46, 56, 143–145; 327/101, 164, 165, 172, 182, 227–230

(56) References Cited

U.S. PATENT DOCUMENTS 4,904,959 A * 2/1990 Gornati ....................... 331/111
5,614,871 A * 3/1997 Miyabe ....................... 331/111
5,701,105 A * 12/1997 Park ............................ 331/153
5,844,446 A * 12/1998 McAllister et al. ......... 331/111

* cited by examiner

Primary Examiner—Robert Pascal
Assistant Examiner—Joseph Chang
(74) Attorney, Agent, or Firm—Dorsey & Whitney LLP

(57) ABSTRACT

A voltage-controlled variable duty-cycle oscillator includes a current generator whose current Iref mirrored in three one-shots that each include two pair of series-coupled MOS transistors and a timing capacitor. The timing capacitor is precharged to Vcc in the first two one-shots, and to a lesser voltage Vcon in the third one-shot. The oscillator also includes pre and a post-NOR-gate logic. Output signals from the two one-shots are coupled to the pre NOR-gate logic to generate an intermediate oscillator signal whose duty cycle is determined by Iref and by the first two timing capacitors. The intermediate oscillator signal and output from the third one-shot are combined in the post NOR-gate logic to yield a VCO output signal whose duty cycle is determined by the ratio of the timing capacitor in the third one-shot compared to the sum of the timing capacitors in the first and second one-shots. VCO output signal duty cycle is a fairly linear function of Vcon.

22 Claims, 4 Drawing Sheets

US 6,600,379 B2

VOLTAGE-CONTROLLED VARIABLE DUTY-CYCLE OSCILLATOR

FIELD OF THE INVENTION

The invention relates generally to voltage-controlled oscillators (VCOs) and more, and more particularly to variable duty-cycle pulse-width modulated VCOs.

BACKGROUND OF THE INVENTION

Voltage-controlled variable duty-cycle oscillators are found in many applications. FIG. 1, for example, depicts a DC:DC converter 10 that receives an input voltage Vin and delivers an output voltage Vout to a load coupled in parallel with output filter capacitor Co. A feedback loop that includes path 20 provides a resistor-divided R1, R2 fraction of Vout as one input to a fixed gain 15 error amplifier 30. The other input to error amplifier 30 is coupled to Vref, a precision voltage reference source 40, for example a 1.20 VDC bandgap voltage reference. If magnitude of Vout is too low, Vref will be greater than the fraction of Vout coupled to error amplifier 30, and if magnitude of Vout is too high, Vref will be less than the Vout fraction coupled to the error amplifier.

The error output signal (Verr) from amplifier 30 is coupled as an input to comparator 50. Comparator 50 has two inputs, and the other input is coupled to receive a sawtooth output waveform from oscillator 60, for example a 200 KHz sawtooth waveform. The output from comparator 50 is a voltage-controlled variable duty cycle signal. This comparator 50 output signal is input to a driver 70 whose output pulse train is coupled to the input of solid state switch Qs, whose buffered output appears at the emitter of transistor Qout. The Qout emitter signal is low-pass filtered by L1 and capacitor Co. Diode D1 serves to provide a current path during intervals that Qs is turned-off by driver 70.

In the configuration of FIG. 1, Qs and Qout are shown coupled both to an internal regulator 80 and to Vin. Internal regulator 80 can serve to provide operating potential to converter 10 to sustain operation immediately upon power-up to the converter. Further, an input signal coupled to regulator 80 can serve as a mechanism to shut-down operation of converter 10, should the need arise. Note in figure one that a limit circuit 90 is coupled to comparator 50 to establish a minimum and a maximum desired duty cycle for switching of transistor Qs. Limit circuit 90 may be implemented by imposing voltage clamps on the output excursion(s) of comparator 50, or by using digital control techniques. Also shown in FIG. 1 but not here relevant are protective circuit 100 to limit output current for converter 10 and protective circuit 110 to invoke thermal shutdown of the converter.

Assume that Vout is too high in magnitude. Converter 10 senses this error and lowers Vout in the following manner. If Vout is too high, then the fraction of Vout fed back to error amplifier 30 will also be too high, which means the magnitude of Verr will increase. Thus when Verr is compared against the oscillator 60 sawtooth waveform, comparator 50 will detect only the peak portions of the sawtooth waveform. As a result, duty cycle of the comparator output signal, and thus duty cycle associated with switching of transistor Qs, will decrease. Vout will be proportional to the product of (Vin) and (duty cycle), and a decrease in duty cycle will decrease Vout, which is the desired result. On the other hand, if Vout were too low, the fraction of Vout compared against Vref by error amplifier 30 will be too low, and Verr will decrease in magnitude. When comparator 50 compares Verr against the sawtooth waveform from oscillator 60, the comparator will change state at a lower region of the sawtooth waveform, which is to say duty cycle will increase. The increase in duty cycle will increase magnitude of Vout.

While DC:DC converters implemented as shown in FIG. 1 find widespread use, comparator 50 must operate quite rapidly, even with modest amounts of signal overdrive. In brief, comparator 50, especially a rapidly operating integrated circuit comparator can be a relatively expensive component. For example, dual input comparator 50 must typically be implemented with several transistors. Further, since magnitude of the output signal from the comparator dictates converter duty cycle, a limiting circuit 90 is needed to guard against too low or too high a duty cycle.

There is a need for a somewhat simplified voltage-controlled variable duty-cycle oscillator system, including a DC:DC converter system, that preferably operates with a comparator that can be implemented with as few as two transistors. Further, for use with such a system, the minimum or maximum output duty cycle controlled by the comparator should be controlled by a simple ratio of passive components, for example a capacitor ratio.

The present invention provides such a voltage-controlled variable duty-cycle oscillator system, and comparator.

SUMMARY OF THE INVENTION

A voltage-controlled variable duty-cycle oscillator includes a reference current generator in which a resistor R1 determines magnitude of a current Iref that is mirrored in a first one-shot, in a second one-shot, and in a third one-shot. The oscillator further includes pre- and post-logic circuits, preferably implemented using NOR gates. Each one-shot includes two pair of series-coupled MOS transistors and a timing capacitor. In the first and second one-shots, the timing capacitor (C1, C2) is precharged to Vcc, and in the third one-shot, the timing capacitor (C3) is precharged to a control voltage Vcon<Vcc. A ramp-like voltage is developed across each timing capacitor, proportional in part to the mirrored current Iref that is established by resistor R1. If desired, one-shot operation could in essence be inverted to charge up timing capacitors from ground to Vcc−Vth (for a PMOS device). However the same timing relationships would still be applicable.

Within each one-shot, a series-coupled MOS transistor pair functions as a two-transistor comparator circuit. Advantageously, one-shot time-out duration is determined substantially solely by the associated timing capacitor value and the resistor-determined mirrored current magnitude. Output signals from the first and second one-shot are coupled as inputs to the pre-logic circuit whose output is an intermediate oscillator signal OSCint. The duty cycle of the OSCint signal is determined by Iref and by the timing capacitor associated with the first and second one-shot. In the third one-shot, the associated timing capacitor is precharged to Vcon and time-out for this one-shot is determined substantially solely by magnitude of Vcon.

The output of the third one-shot and the intermediate oscillator signal are input to the post-logic circuit, whose output signal VCOout is the desired variable duty cycle voltage-controlled oscillator (VCO) output signal. Leading edges of the intermediate oscillator signal OSCint are not affected by the post-logic circuit, but the trailing edge of the post-logic output signal is affected by magnitude of the Vcon voltage used to precharge the timing capacitor C3 associated with the third one-shot. If Vcon<Vcc, then the maximum duty cycle of the VCO output signal is determined by the ratio of the timing capacitor in the third one-shot compared to the sum of the timing capacitors in the first and second one-shots, e.g., by C3/(C1+C2). Minimum duty cycle for the VCO output signal can be zero if Vcon<Vth (threshold voltage) for MOS device in the third one-shot whose gate is coupled across the associated timing capacitor. Advantageously, VCO output signal duty cycle is a very linear function of Vcon.

Other features and advantages of the invention will appear from the following description in which the preferred embodiments have been set forth in detail in conjunction with the accompanying drawings.

DETAILED DESCRIPTION OF THE PREFERRED EMBODIMENTS

Figure 1:
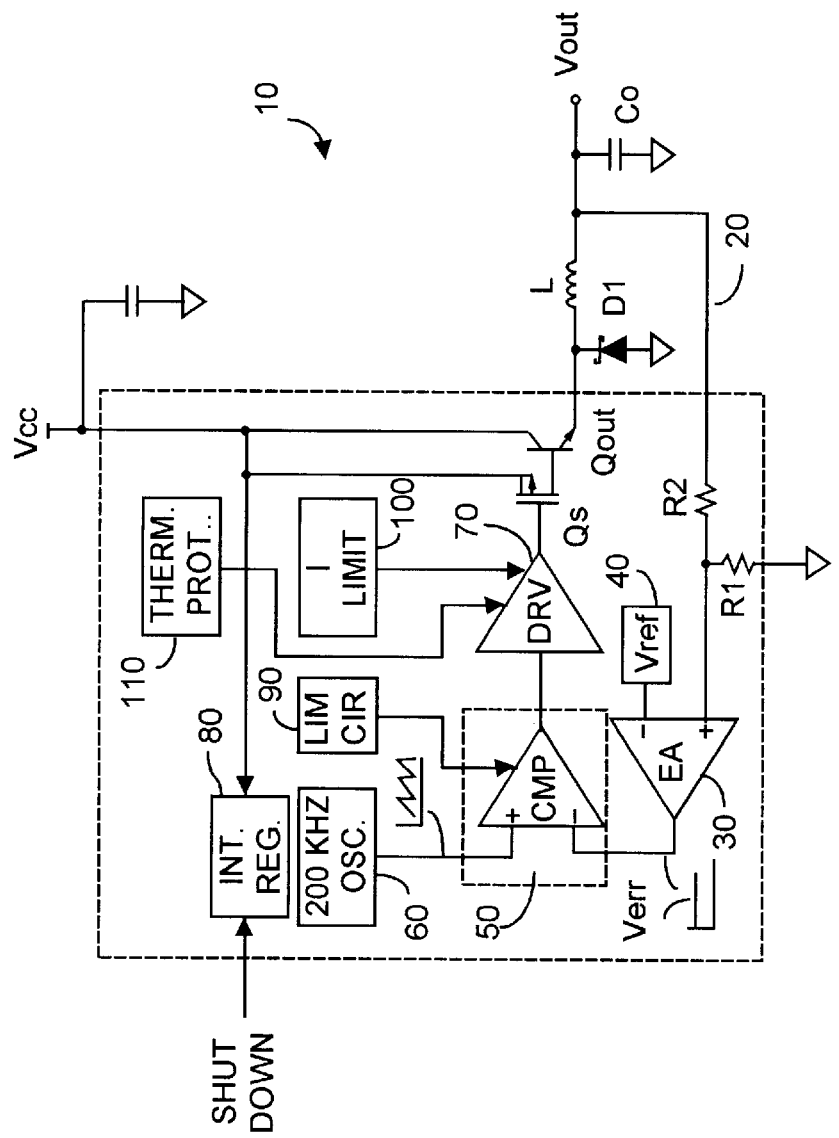
FIG. 1 depicts a DC:DC converter system with a voltage controlled oscillator that includes a conventional multi-transistor comparator, according to the prior art.
Figure 2:
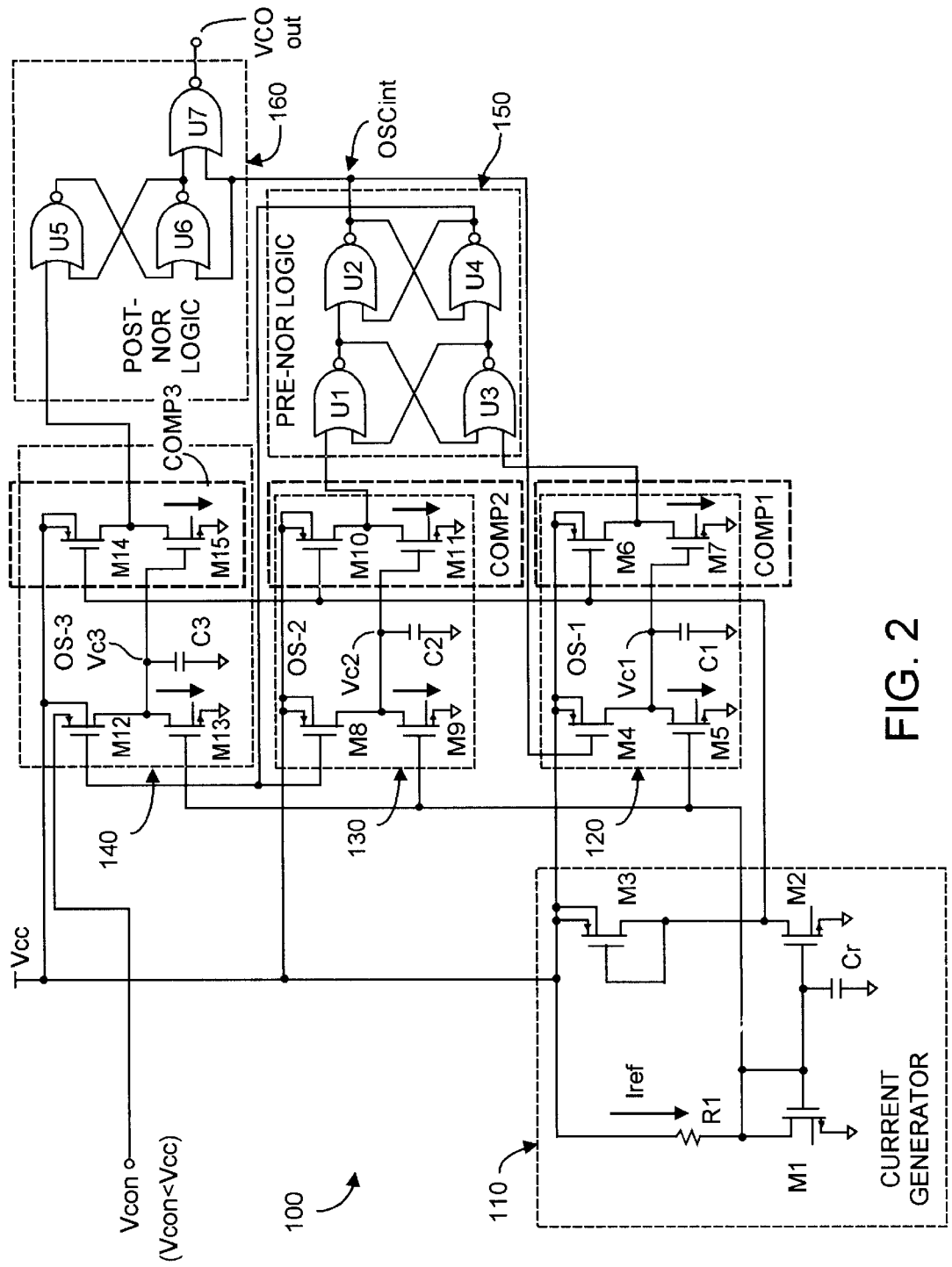
FIG. 2 depicts a voltage controlled oscillator that includes two-transistor comparators, according to the present invention.

FIG. 2 depicts a voltage controlled variable duty cycle oscillator (VCO) 100, according to the present invention, which VCO preferably is implemented using CMOS technology on a single integrated circuit chip. VCO 100 is coupled to a source of operating potential Vcc, and to a control voltage signal Vcon that preferable is less than Vcc. VCO 100 outputs a VCO signal (VCOout) whose duty cycle varies linearly (e.g., within about 0.1%) as a function of magnitude of Vcon. As will be described, maximum duty cycle for the VCOout signal is determined by the ratio of timing capacitors C3/(C1+C2). If magnitude of Vcon is less than threshold voltage (Vth) for MOS device M15, then minimum duty cycle for the VCOout signal is essentially zero.

VCO 100 may be described as comprising several subsystems: a reference current generator 110, a first one-shot 120 (OS-1) that includes a first timing capacitor C1, a second one-shot 130 (OS-2) that includes a second timing capacitor C2, and a third one-shot 140 (OS-3) that includes a third timing capacitor C3. VCO 100 further includes pre-NOR logic 150 that combines outputs of the first and second one-shots to yield an intermediate oscillator signal OSCint, and post-NOR logic 160 that combines the OSCint signal with the output of the third one-shot to yield the desired VCOout signal.

In brief, timing capacitors C1 and C2 are precharged to a reference potential, here Vcc, by transistors M4 and M8, respectively, in the first and second one shots 120 and 130. On the other hand, timing capacitor C3 in the third one-shot 140 is precharged by transistor M12 to the magnitude of the control voltage, Vcon. The above statements assume that the on-resistance (Ron) of the MOS devices M8, M4 is small relative to the magnitude of the associated timing capacitor such that the "Ron·C" time constant permits substantially complete pre-charging. In practice, if the "Ron·C" time constant is less than about five times the time allotted for pre-charge, the pre-charge voltage attained by the timing capacitors will be acceptably close to Vcc (for C1 or C2), or to pre-charge level Vcon (for C3). As noted elsewhere, it is not necessary that the various timing capacitors be pre-charged to one potential and then have capacitor voltage discharge to a less potential. If desired, the various one-shot configurations could be implemented to precharge the timing capacitors from a reference potential that is ground (or some other potential <<Vcc), up to a higher reference potential, e.g., Vcc−Vth (where Vth is threshold voltage for a PMOS device).

Looking first at the reference current generator 110 in the lower left corner of FIG. 2, the voltage drop across resistance R1 is essentially (Vcc−Vth), where Vth is the threshold voltage for transistor M1. Since all MOS devices in VCO 100 preferably are fabricated on the same integrated circuit chip, ideally Vth for M1 will be the same as Vth for all n-channel or NMOS transistors in VCO 100. The magnitude of current Iref is (Vcc−Vth)/R1. M1, M2, M3 function as a current mirror such that substantially identical current flow occurs in MOS transistors M5, M7 in first one-shot 120, in MOS transistors M9 and M11 in second one-shot 130, and in MOS transistors M13, M15 in third one-shot 140. These mirrored currents are shown as thick arrowed lines associated with MOS transistors M5, M7, M9, M1, M13, and M15.

Figure 3A:
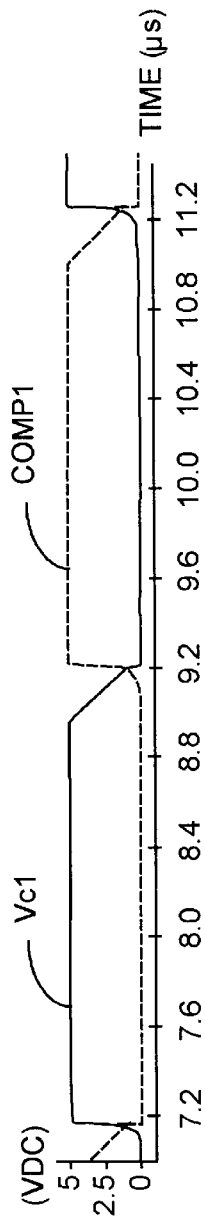
FIGS. 3A–3C depict timing capacitor and COMP output waveforms for the first, second, and third comparators, according to the present invention.

Assume initially that within first one-shot 120, M4 pre-charges C1 to Vcc, a voltage that is greater than Vth for M7 (and indeed each other MOS transistor in VCO 100). M7 will turn-on, and the drain node of M7 will go low, which turns M4 off. The result is that whatever potential was present at node VC1 across timing capacitor C1 will begin to be discharged by M5, which acts as a current source with a discharge current proportional to Iref. Waveforms for the first one-shot 120 are shown in FIG. 3A, which depicts the voltage Vc1 across timing capacitor C1, and the output signal from COMP 1.

Once the voltage across timing capacitor C1 discharges down to the Vth for M7, M7 will turn-off, and its drain node will be pulled high by M6. In this sense M6 and M7 function as a rather simple two-transistor comparator, denoted COMP 1. Collectively, it will now be appreciated that M4, M5, M6, M7, and C1 indeed comprise a one-shot. The one-shot time-out value (e.g., duration of the monostable state) is determined substantially solely by the magnitude of resistor R1 in current generator 110, and by magnitude of timing capacitor C1, and is substantially independent of variations in Vcc and/or die-to-die variations in the MOS devices used to implement VCO 100.

The above-noted independence of the one-shot time-out value, denoted dt1 for the first one-shot OS-1 or 120 may be demonstrated as follows:

$$Iref=(Vcc-Vth1)/R1$$

where Vth1 is M1 threshold voltage. From i=C·dV/dt, it follows that:

$$Iref=C1·dV/dt1$$

stated differently:

$$dt1=C1·dV/Iref=C1·(Vcc-Vth4)/Iref$$

where Vth4 is threshold voltage for M4. But since Iref=(Vcc−Vth1)/R1, we can now write:

$$dt1=R1·C1·(Vcc-Vth4)/(Vcc-Vth1)$$

But since M1 and M4 are ideally identical in size and are fabricated on the same integrated circuit chip, Vth4=Vth1, with the result that:

$$dt1 = R1 \cdot C1$$

Figure 3B:
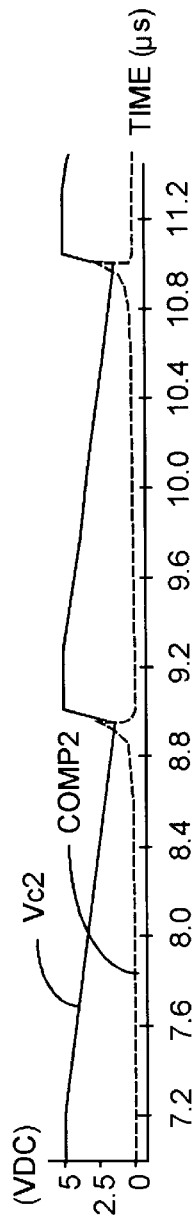

In similar fashion to the first one-shot, second one-shot 130, M8 precharges C2 to Vcc, a voltage that is greater than Vth for M11. M11 will turn-on, its drain node will go low, turning-off M8. Whatever potential was present at node VC2 across timing capacitor C2 begins to be discharged by M9, which acts as a current source with a discharge current proportional to Iref. FIG. 3B depicts the voltage Vc2 across timing capacitor C2, and the output of COMP 2.

When voltage across timing capacitor C2 discharges down to the Vth for M11, M11 will turn-off, and its drain node will be pulled high by M10. Similar to what was described above, M10 and M11 function as a rather simple two-transistor comparator, denoted COMP 2., and M8, M9, M10, M11, and C2 indeed comprise a one-shot. Similar to the above derivation for dt1, it follows that the time-out value dt2 for the second one-shot 130 is:

$$dt2 = R1 \cdot C2$$

Figure 3C:
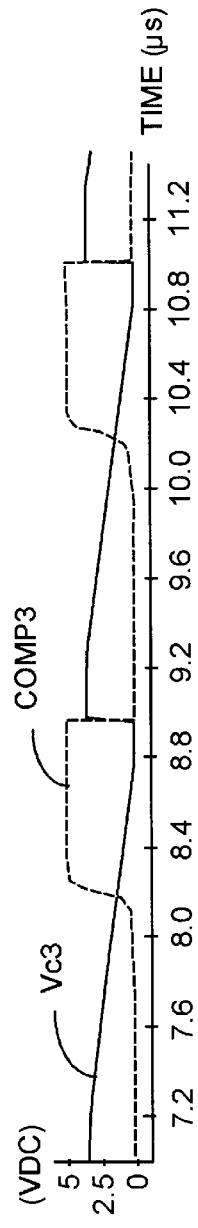

Referring to FIG. 2 and well as FIG. 3C, the third one-shot 140 operates in similar fashion to what has been described, except that rather than being precharged to Vcc, MOS transistor M12 precharges third timing capacitor C3 to the magnitude of control voltage Vcon. Within the third one-shot, transistors M14, M15 function as a simple two-transistor comparator COMP 3.

For the third one-shot 140, the following can be shown:

$$dt3 = R1 \cdot C3 \cdot (Vcon - Vth12)/(Vcc - Vth1)$$

where Vth12 is threshold voltage for M12, which threshold voltage is understood to be substantially equal to Vth for M1, for M4, for M8, etc. Thus, the third-timeout period dt3 is directly proportional to magnitude of Vcon.

Pre-NOR logic unit 150 comprises cross-coupled NOR gates U1, U2, U3, U4.

Figure 3D:
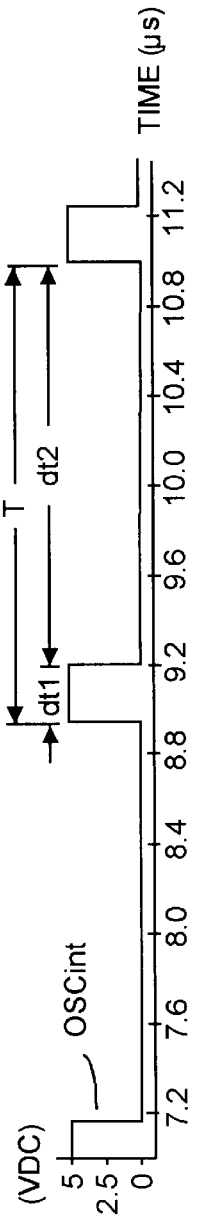
FIG. 3D depicts the OSCint intermediate waveform, according to the present invention.

Logic unit 150 receives as input the output signals provided by COMP1 (e.g., source lead of M6) and by COMP 2 (e.g., source lead of M10). The output from pre-NOR logic unit 150 is an intermediate VCO signal denoted OSCint. As shown in FIG. 3D, the high or "1" state of the OSCint signal is determined by dt2 (e.g., by magnitude of resistor R1 and capacitor C2), and the low or "0" state is determined by dt1 (e.g., by R1 and C1). The period T of the OSCint signal is thus T=dt1+dt2, which is to say:

$$T = R1 \cdot (C1 + C2)$$

Figure 3E:
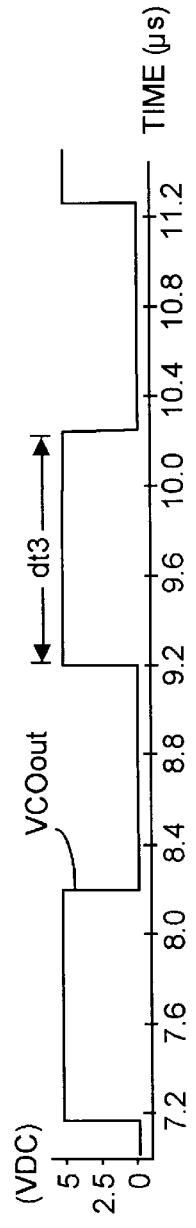
FIG. 3E depicts the VCOout output waveform generated by the present invention.

In a departure from prior art VCOs, the present invention now takes the intermediate VCO signal OSCint and combines it in post-NOR logic 160 with the output signal from COMP 3 in third one-shot 140, e.g., the signal from the source of M14). As shown in FIG. 2, post-NOR logic 160 preferably includes NOR gates U5, U6, U7. The output from logic unit 160 is provided by U7 and is the desired VCO output signal, denoted VCOout, which waveform is shown in FIG. 3E.

In the configuration shown, the leading edge of the OSCint signal is preserved through post-NOR logic 160, but the trailing edge is modulated in time as a function of magnitude of the Vcon control signal. Duty cycle for the VCO output signal, VCOout, is given by:

$$dt3/(dt1+dt2) = \{C3/(C1+C2)\} \cdot \{(Vcon-Vth12)/Vcc-Vth1)\}$$

Since all threshold voltages Vth are substantially equal, when Vcon=Vth, duty cycle is zero. If Vcon<Vcc at all times, then it is seen that maximum duty cycle for OSCout is determined by the capacitor ratio C3/(C1+C2).

Figure 4:
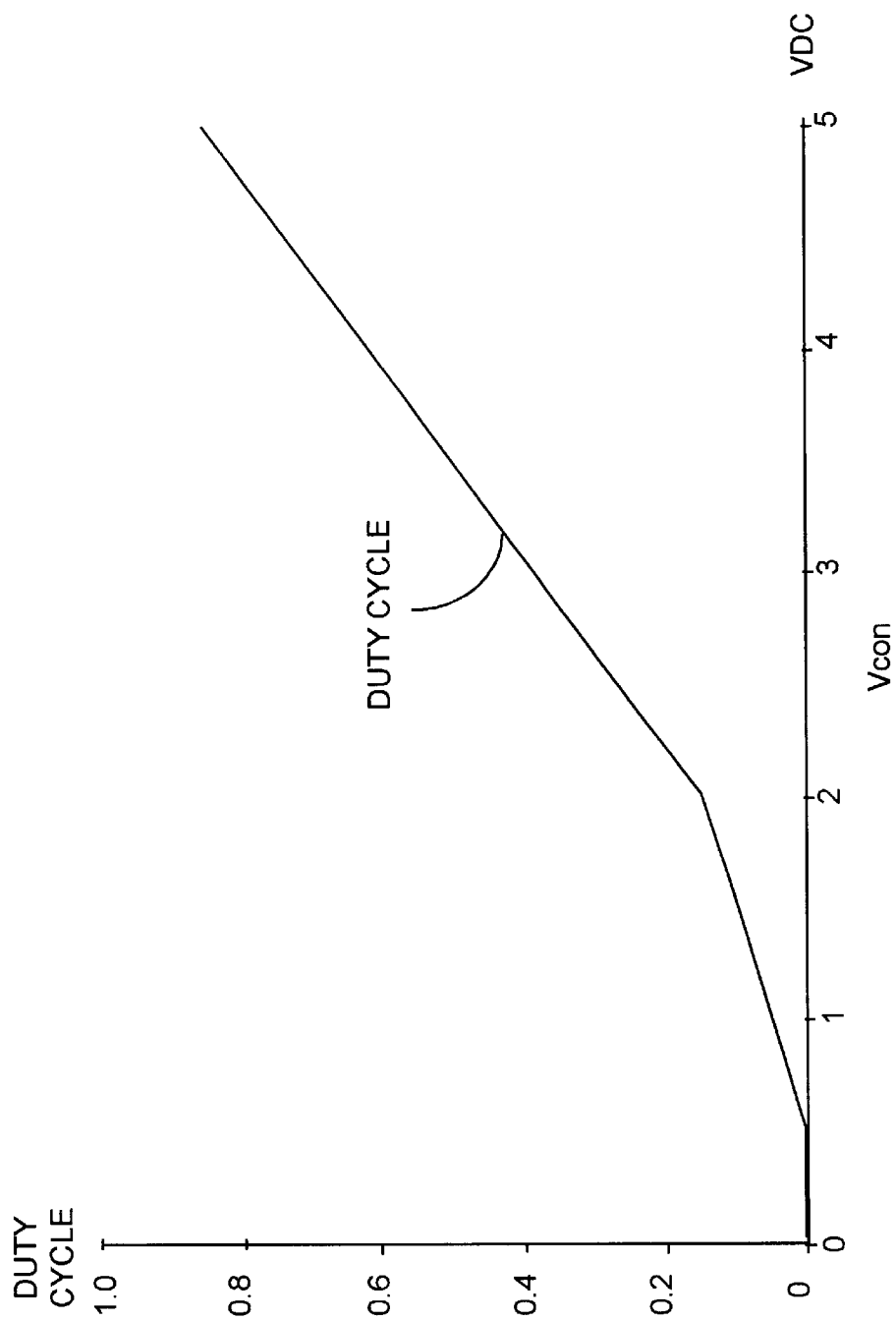
FIG. 4 is a graph of duty cycle versus magnitude of Vcon, depicting linearity achieved by the present invention.

FIG. 4 depicts duty cycle (normalized to 1=100%) of OSCout as a function of magnitude of the control voltage Vcon. As shown in FIG. 4, duty cycle of the VCOout signal a very linear function of Vcon, and linearity can be within about 0.1%.

In an exemplary embodiment, Vcc was about 5 VDC, R1 was about 170K, C1 was about 1 pF, C2 was about 9 pF, and C3 was about 8.5 pF. Nominal VCO frequency of oscillation VCOout was about 500 KHz, and varying magnitude of Vcon from about 2 VDC to about 5 VDC varied duty cycle from about 15% to about 85%, with a linearity of about 0.1%.

It will be appreciated that the configuration of FIG. 2 could be modified to vary the leading edge of the intermediate OSCint signal, leaving the trailing edge intact, and/or to set minimum rather than maximum duty cycle for the VCOout signal. As noted, pre- and post-NOR gate logic units could be implemented with other logic components, NAND gates for example. Also, the design of the one-shots could be changed such that timing capacitors start out at a low potential, e.g., ground, and then charge up toward a higher potential, e.g., Vcc−Vth (where Vth is threshold voltage for a PMOS device used in system 100).

Modifications and variations may be made to the disclosed embodiments without departing from the subject and spirit of the invention as defined by the following claims.

What is claimed is:

1. A voltage-controlled variable duty-cycle oscillator system coupleable to a source of operating potential Vcc, comprising:

a reference current generator providing a current Iref determined in part by a resistor R1;

a first one-shot comprising a first and second pair of series-coupled MOS transistors and a first timing capacitor coupled to be charged or discharged by a common node in said first pair of transistors, charging being to a voltage proportional to said Vcc and discharge being at a current rate proportional to said resistor R1;

a second one-shot comprising a third and a fourth pair of series-coupled MOS transistors and a second timing capacitor coupled to be charged or discharged by a common node in said third pair of transistors, charge being to a voltage proportional to said Vcc and discharge being at a current rate proportional to said resistor R1;

a first logic unit combining an output signal from a common node of said second pair of transistors in said first one-shot, and an output signal from a common node of said fourth pair of transistors in said second one-shot, and outputting an intermediate voltage controlled signal OSCint;

a third one-shot comprising a fifth and a sixth pair of series-coupled MOS transistors and a third timing capacitor coupled to be charged or discharged by a common node in said fifth pair of transistors, charge being to a voltage proportional to a control voltage Vcon, and discharge being at a current rate proportional to said resistor R1; and a second logic unit combining said signal OSCint with an output signal from a common node of said sixth pair of series-coupled MOS transistors to yield an output signal VCOout;

said output signal VCOout having a duty cycle proportional to magnitude of said control voltage Vcon.

2. The oscillator system of claim 1, wherein a threshold voltage Vth for each of said MOS transistors is the same.

3. The oscillator system of claim 1, wherein maximum duty cycle of said output signal VCOout is determined by a ratio of said third timing capacitor divided by a sum of said first timing capacitor and said second timing capacitor.

4. The oscillator system of claim 1, wherein in said first one-shot, said second pair of series-coupled MOS transistors functions as a two-transistor comparator.

5. The oscillator system of claim 1, wherein in said second one-shot, said fourth pair of series-coupled MOS transistors functions as a two-transistor comparator.

6. The oscillator system of claim 1, wherein in said second one-shot, said sixth pair of series-coupled MOS transistors functions as a two-transistor comparator.

7. The oscillator system of claim 1, wherein said first logic unit includes cross-coupled NOR gates.

8. The oscillator system of claim 1, wherein said second logic unit includes cross-coupled NOR gates.

9. The oscillator system of claim 1, wherein said current generator provides said current Iref in a current mirror configuration.

10. The oscillator system of claim 1, where in at least one of said first timing capacitor and said second timing capacitor is charged to a potential Vcc.

11. The oscillator system of claim 1, wherein said third timing capacitor is charged to a potential Vcon.

12. The oscillator system of claim 1, wherein at least one of said first one-shot and said second one-shot has a time-out substantially independent of variation in said Vcc and in die-to-die variation in a process used to fabricate each said MOS transistor.

13. The oscillator system of claim 1, wherein discharge in at least one of said one-shots is at a current substantially equal to said Iref.

14. The oscillator system of claim 1, wherein a first logical state of said output signal VCOout is determined by said Iref and by said first timing capacitor, and a complementary logical stage of said output signal VCOout is determined by said Iref and by said second timing capacitor.

15. An integrated circuit (IC) chip comprising:
a voltage-controlled variable duty-cycle oscillator system coupleable to a source of operating potential Vcc, including:
a reference current generator in current-mirror configuration providing a current Iref;
a first one-shot comprising a first and second pair of series-coupled MOS transistors and a first timing capacitor coupled to be charged or discharged by a common node in said first pair of transistors, charging being to a voltage proportional to said Vcc and discharge being at a current rate proportional to said Iref;
a second one-shot comprising a third and a fourth pair of series-coupled MOS transistors and a second timing capacitor coupled to be charged or discharged by a common node in said third pair of transistors, charge being to a voltage proportional to said Vcc and discharge being at a current rate proportional to said Iref;
a first logic unit combining an output signal from a common node of said second pair of transistors in said first one-shot, and an output signal from a common node of said fourth pair of transistors in said second one-shot, and outputting an intermediate voltage controlled signal OSCint;

a third one-shot comprising a fifth and a sixth pair of series-coupled MOS transistors and a third timing capacitor coupled to be charged or discharged by a common node in said fifth pair of transistors, charge being to a voltage proportional to a control voltage Vcon, and discharge being at a current rate proportional to said Iref; and a second logic unit combining said signal OSCint with an output signal from a common node of said sixth pair of series-coupled MOS transistors to yield an output signal VCOout;

said output signal VCOout having a duty cycle proportional to magnitude of said control voltage Vcon;

wherein each of said MOS transistors has a same threshold voltage Vth; and wherein maximum duty cycle of said output signal VCOout is determinable by a ratio of said third timing capacitor divided by a sum of said first timing capacitor and said second timing capacitor.

16. The integrated circuit of claim 15, wherein in said one-shot, one pair of series-coupled MOS transistors functions as a two-transistor comparator.

17. The integrated circuit of claim 15, wherein one of said first logic unit and said second logic unit includes cross-coupled NOR gates.

18. The integrated circuit of claim 15, wherein at least one of said first timing capacitor and said second timing capacitor is charged to a potential Vcc.

19. The integrated circuit of claim 15, wherein said third timing capacitor is charged to a potential Vcon.

20. The integrated circuit of claim 15, wherein at least one of said first one-shot and said second one-shot has a time-out substantially independent of variation in said Vcc and in die-to-die variation in a process used to fabricate each said MOS transistor.

21. The integrated circuit of claim 15, wherein a first logical state of said output signal VCOout is determined by said Iref and by said first timing capacitor, and a complementary logical stage of said output signal VCOout is determined by said Iref and by said second timing capacitor.

22. A method of varying duty cycle in a voltage controlled variable duty cycle oscillator that is coupleable to a source of operating potential Vcc, comprising the following steps:
mirror-generating a reference current Iref;
providing a first one-shot function whose time-out duration is proportional to said Iref and to a first timing capacitor prechargeable to a voltage proportional to said Vcc;
providing a second one-shot function whose time-out duration is proportional to said Iref and to a second timing capacitor prechargeable to a voltage proportional to said Vcc;
logically combining an output from said first one-shot function and from said second one-shot function to obtain an intermediate voltage controlled signal OSCint;
providing a third one-shot function whose time-out duration is proportional to said Iref and to a third timing capacitor prechargeable to a control signal Vcon;
logically combining said signal OSCint with an output signal from said third one-shot function to yield an output signal VCOout having at least one characteristic selected from a group consisting of (i) a duty cycle proportional to magnitude of said control voltage Vcon, and (ii) a maximum duty cycle determinable by a ratio of said third timing capacitor divided by a sum of said first timing capacitor and said second timing capacitor; and wherein magnitude of said control signal Vcon controls duty cycle of output signal VCOout linearly within about 0.2%.

* * * * *